(12) United States Patent
Sjogren et al.

(10) Patent No.: US 7,809,867 B2
(45) Date of Patent: Oct. 5, 2010

(54) KEYPAD DE-BOUNCING APPARATUS AND METHOD

(75) Inventors: Allen Erik Sjogren, Park City, UT (US); Eric Nerdrum, Kaysville, UT (US)

(73) Assignee: Fluke Corporation, Everett, WA (US)

( * ) Notice: Subject to any disclaimer, the term of this patent is extended or adjusted under 35 U.S.C. 154(b) by 259 days.

(21) Appl. No.: 11/940,160

(22) Filed: Nov. 14, 2007

(65) Prior Publication Data

US 2009/0125651 A1    May 14, 2009

(51) Int. Cl.
G06F 13/12    (2006.01)
H03K 17/94    (2006.01)

(52) U.S. Cl. .......................... 710/67; 341/24

(58) Field of Classification Search ............ 710/67; 341/24
See application file for complete search history.

(56) References Cited

U.S. PATENT DOCUMENTS 5,760,714 A    6/1998    Zimmerman ................ 341/26

2006/0049965 A1    3/2006    Laliberte et al. .............. 341/24
2007/0159363 A1    7/2007    Suen et al. .................... 341/26

FOREIGN PATENT DOCUMENTS

EP    0580347 A1    1/1994

OTHER PUBLICATIONS

Definition of 'reference voltage', 1996, Academic Press.*

* cited by examiner

Primary Examiner—Henry W. H. Tsai
Assistant Examiner—Hyun Nam
(74) Attorney, Agent, or Firm—Dorsey & Whitney LLP

(57) ABSTRACT

An apparatus and method for de-bouncing keypad inputs is disclosed including interrupting a processor upon detecting a key press, reading input signals from the key pad to determine an initial port value and starting a timer. A keypad interrupt is disabled and processing resumes until expiration of the timer. The timer interrupts the processor and the input signals are read a second time and combined with the initial port value to determine a key identifier. The timer is started again and processing resumes. Upon expiration of the timer the processor checks for key release. If release is not detected, the timer is again started. If release occurs, the timer is disabled and the keypad interrupt is enabled.

16 Claims, 3 Drawing Sheets

KEYPAD DE-BOUNCING APPARATUS AND METHOD

TECHNICAL FIELD

This invention relates generally to systems and methods for calibrating thermal switches.

BACKGROUND OF THE INVENTION

Push-button keypads are often used to provide input to processors. However, the mechanical switches used in keypads do not open and close instantaneously. Often the electrical coupling created when a key is pressed will be broken several times before a steady coupling occurs. Often a key will need to connect to multiple contacts in order to communicate a row and column of the key. Accordingly, the delay in achieving steady contact may result in an initial signal that indicates only one of the row or column of the key pressed.

Prior systems resolve this problem by implementing a software delay loop having a duration longer than the settling time of the keypad. In such systems, after an initial signal from the keypad is detected, the processor begins to perform a delay loop until a specified delay has passed and a steady signal can be read to determine the identity of the key pressed.

This approach is problematic for processors embedded within devices, such as drywells, or other instruments. Due to cost limitations or the processing demands of the device, the processing time available to perform de-bouncing may be limited. Given the speed of many microprocessors, the amount of processor time dedicated to debouncing could be used to perform a large number of calculations.

In view of the foregoing it would be an advancement in the art to provide a system and method for de-bouncing signals from a keypad without requiring processor delays on the order of the settling time of the keypad.

SUMMARY OF THE INVENTION

In one aspect of the invention an electronic device includes a keypad having a number of keys selectively depressible to send input signals to a processor. The keys include conductive members selectively coupling row and column signal contacts to a reference voltage. The processor is programmed to read input signals from the key pad. The processor stores a first value corresponding to input signals received after a key press is initially detected. Upon expiration of the timer, the processor is interrupted and the input signals from the key pad are again read and combined with the first value to determine a key identifier.

In another aspect of the invention, the processor is further programmed to detect release of a pressed key. The processor checks for key release and if it is not detected, starts a timer and resumes processing. Upon expiration of the timer, processing is interrupted and the processor again checks for key release. These steps may be repeated until release is detected. In another aspect of the invention, pressing a key triggers a hardware interrupt. The hardware interrupt may be disabled by the processor after detecting a key press and enabled after release is detected.

DETAILED DESCRIPTION OF PREFERRED EMBODIMENTS

Figure 1:
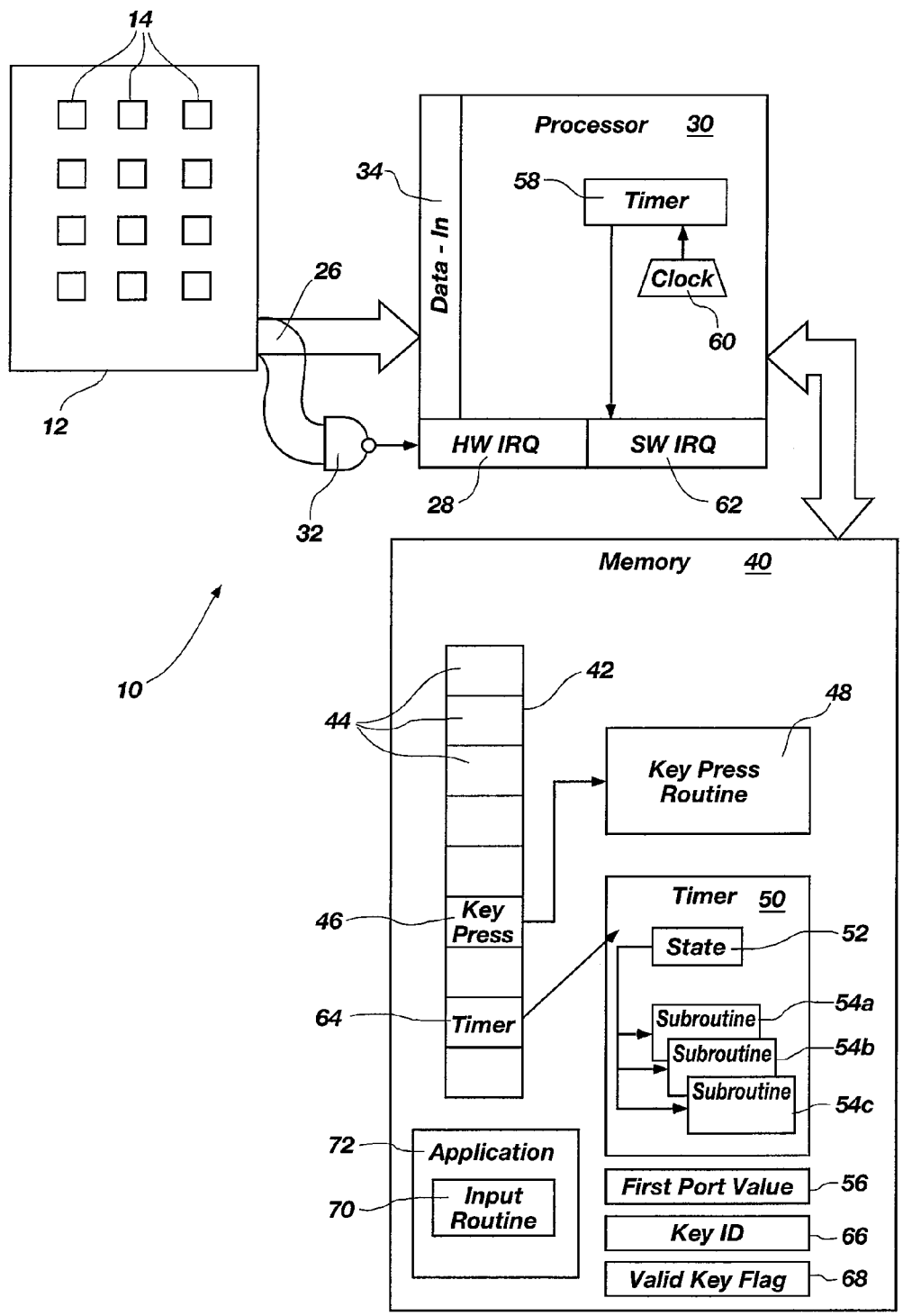
FIG. 1 is a block diagram of an electronic device including a keypad in accordance with an embodiment of the present invention.
Figure 2:
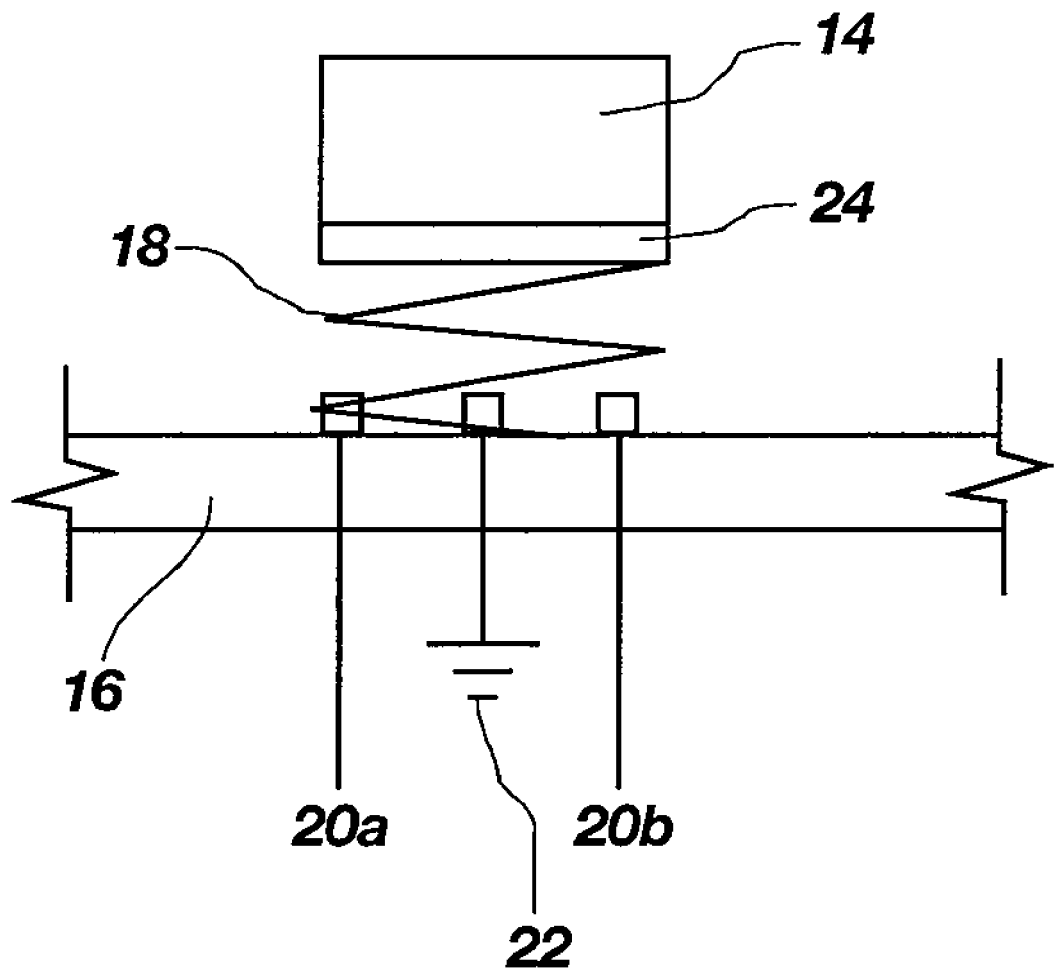
FIG. 2 is a schematic diagram of a key, in accordance with an embodiment of the invention.

Referring to FIG. 1, an electronic device 10 may include a keypad 12 having a plurality of keys 14. Referring to FIG. 2, while still referring to FIG. 1, the keys 14 may be mounted above a circuit board 16, or other substrate, having a resilient member 18, such as an elastic polymer, spring, or like structure, interposed between the keys 14 and the circuit board 16. A row contact 20a, column contact 20b, and reference contact 22 may be mounted to the circuit board 16. A conductive member 24 located between the keys 14 and the contacts 20a, 20b, 22 may be brought into contact therewith when a user depresses the keys 14. Upon depression of the keys 14, the contacts 20a, 20b are electrically coupled by the conductive member 24 to the reference contact 22. In the illustrated embodiment, the reference contact 22 is coupled to ground such that an output line coupled to the contacts 20a, 20b will experience a voltage drop when the keys 14 is pressed. As noted above, the contacts 20a, 20b may not electrically couple to the reference contact 22 simultaneously and may make and break contact a number of times before establishing steady electrical coupling.

The outputs 26 of the keypad 12 may be electrically coupled to a hardware interrupt 28 and data-in pins 34 of a processor 30. In one embodiment, the outputs 26 are coupled to the interrupt 28 by means of a NAND gate 32 such that a voltage drop on any of the outputs 26 will result in a change in the signal applied to the interrupt 28. A drop in any of the outputs 26 will therefore trigger a hardware interrupt within the processor 30. The processor 30 will then interrupt its current processing and begin executing an interrupt handling routine.

In some embodiments, a memory 40 is coupled to the processor 30. The memory 40 may include an interrupt vector 42 having a plurality of pointers 44 referencing interrupt handling routines stored within the memory 40. In some embodiments, the interrupt vector 42 is internal to the processor 30. The pointers 44 may include a pointer 46 to a key press interrupt routine 48, invoked when the hardware interrupt 28 is triggered.

In one embodiment, the key press routine 48 instructs the processor 30 to catch the signal exerted on the data-in pins 34. The key press routine 48 also disables the hardware interrupt 28 triggered by key presses such that subsequent key presses will not trigger the key press routine 48. The key press routine 48 may also enable a timer 58 and a timer interrupt and invoke a timer routine 50. The timer routine 50 may include a state 52 indicating which of a plurality of subroutines 54a-54c will be executed when the timer routine 50 is invoked.

Upon being invoked by the key press routine 48, the timer routine 50 may be in a first state corresponding to subroutine 54a. Subroutine 54a may instruct the processor 30 to read the value on the data-in pins 34 connected to the keypad 12 and to store the result as a first port value 56. The subroutine 54a may change the value of the state 52 such that upon subsequent invocation of the timer routine 50, the subroutine 54b will be executed. The routine 54a may also start the timer 58, which may be either connected to or embedded within the processor 30. The timer 58 may be coupled to a clock 60 such that the clock signals will cause the timer to count up to a specific value or down to zero. The timer 58 preferably measures a delay period sufficient for the output of the keypad 12 to settle. The timer 58 preferably does not require calculation or command execution by the processor in order to measure out the delay period. Accordingly, after the subroutine 54a sets the timer, the processor 30 may resume processing instructions unrelated to de-bouncing keypad inputs. Upon expiration of the timer 58, the timer 58 triggers a software interrupt 62. The processor 30 may then reference the interrupt vector 42 in response to the software interrupt 62. In the illustrated embodiment, the interrupt vector 42 includes a pointer 64 associating the software interrupt 62 to the timer routine 50, such that the processor 30 will execute the timer routine 50 upon receiving the interrupt from the timer 58.

As noted above, the state 52 of the timer routine 50 is set to select the subroutine 54b after being invoked by the key press routine 48. Accordingly, upon expiration of the timer 58, the interrupt will cause the processor 30 to execute the subroutine 54b. The subroutine 54b instructs the processor 30 to read the values of the outputs 26 a second time to obtain a second port value. The subroutine 54b may then combine the second port value with the first port value 56. In one embodiment, the port values are combined by ANDing. In an alternative embodiment, only the second port value is used and the first port value is ignored. The combined port values, or second port value, may then be stored as a key identifier 66.

In some embodiments, release of the keys 14 by the user is detected. The hardware interrupt 28 corresponding to a key press may remain disabled until release is detected. In such embodiments, subroutine 54b may change the state 52 to reference the third subroutine 54c and restart the timer 58. The processor 30 then resumes processing.

Upon expiration of the timer 58, the software interrupt is again triggered and the processor 30 references the interrupt vector 42, which directs the processor 30 to the timer routine 50. The timer 58 has the state 52 set to refer to the third subroutine 54c. The processor 30 therefore executes the third subroutine 54c, which instructs the processor 30 to check the data-in pins 34 to determine if the keys 14 has been released. If not, the subroutine 54c restarts the timer 58 and the processor resumes processing instructions unrelated to de-bouncing the key press. Upon expiration, the timer interrupt will again invoke subroutine 54c.

If release of the keys 14 is detected, the subroutine 54c instructs the processor 30 to disable the timer 58, enable the hardware interrupt 28 corresponding to a key press, and to set a flag 68 indicating that a key input has been received. In some embodiments, the subroutine 54c validates the key identifier 66 to determine if it corresponds to a valid key. If it does not correspond to a valid key, the subroutine 54c does not set the flag 68 to indicate that a valid input has occurred.

The subroutine 54c may also change the state 52 to refer to the first subroutine 54a. The subroutine 54c may set the value of the timer 58 to some initial value such that the next time the timer 58 is started it can simply commence counting down. The processor 30 may respond to the valid key flag 68 by invoking an input handling routine 70, which may be part of an application 72, operating system, or other program, being executed by the processor 30.

Figure 3:
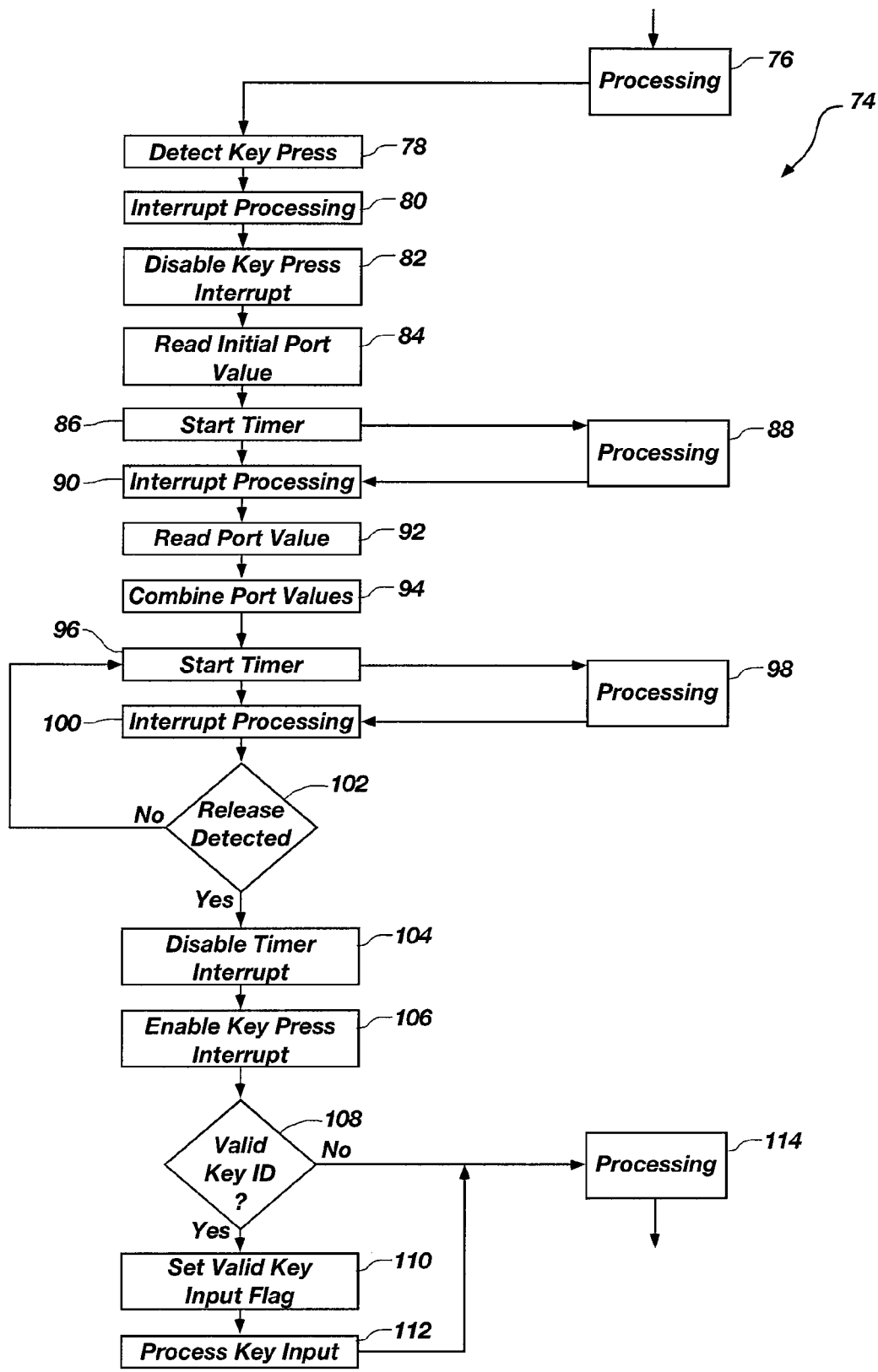
FIG. 3 is a process flow diagram of a method for de-bouncing key inputs in accordance with an embodiment of the present invention.

Referring to FIG. 3, a method 74 for debouncing a keypad input may include performing processing at block 76. Processing may include execution of instructions by the processor 30 unrelated to de-bouncing a key press, such as an application 72, operating system, or other program. At block 78, a key press is detected and at block 80 processing is interrupted. Interrupting processing may include causing the processor 30 to perform a context switch in which its current context is saved and the processor 30 begins processing relating to handling the key press. At block 82, the hardware interrupt 28 corresponding to key presses is disabled such that subsequent key presses will not interrupt processing. At block 84, the data-in pins 34 are read and the read data is stored. At block 86, a timer is started. At block 88, processing of instructions unrelated to de-bouncing the key press resumes.

Upon expiration of the timer, processing is interrupted again at block 90. The processor reads the data-in pins 34 a second time at block 92. At block 94, the data read at block 92 is combined with the data read at block 84 to determine a key identifier. Alternatively, only the value read at block 92 is used. In such embodiments, the block 84 may be omitted or the read data ignored. At block 96, the timer is started again and processing instructions unrelated to de-bouncing the key press resumes at block 98.

Processing is interrupted at block 100 upon expiration of the timer 58 and at block 102 the method 74 includes evaluating whether the pressed key 14 has been released. If not, then the steps of blocks 96-102 are repeated. If at block 102, release of the pressed keys 14 is detected, then the timer is disabled at block 104, and the hardware interrupt 28 corresponding to key presses is enabled at block 106. At block 108, the key identifier may be evaluated to determine whether it corresponds to a valid key input. If it does, then a valid key input flag is set at block 110 and the input may be processed at block 112, such as by the application 72, an operating system, or other program. At block 114, processing of instructions unrelated to de-bouncing a key press resumes.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

What is claimed is:

1. A method for inputting data comprising:
   selectively coupling a reference voltage to a first signal contact by a user, the first signal contact forming part of a first of a plurality of key contact groups each key contact group comprising two signal contacts;
   storing a first value corresponding to the first signal contact;
   interrupting computational processing of a processor;
   initiating a timer and resuming computational processing of the processor;
   selectively coupling a second signal contact of the first key contact group to the reference voltage by a user;
   upon expiration of a first timer period, interrupting computational processing of the processor and storing a second value corresponding to the second signal contact;
   combining the first and second values to determine a key identifier;
   reinitiating the timer;
   interrupting computational processing of the processor upon expiration of a second timer period;
   in the event the first or second signal contacts are coupled to the reference voltage, again reinitiating the timer;
   in the event the first and second signal contacts are not coupled to the reference voltage, disabling the timer;
   processing the key identifier by the processor as a user input; and
   resuming computational processing of the processor.

2. The method of claim 1, wherein detecting selective decoupling of the first and second signal contacts occurs after expiration of the first timer period.

3. The method of claim 1, further comprising repeating the step of detecting selective decoupling of the first and second signal contacts from the reference voltage until the timer is disabled.

4. The method of claim 1, wherein the processor comprises a hardware interrupt and wherein selective coupling of the first signal contact to the reference voltage triggers the hardware interrupt, the method further comprising disabling the hardware interrupt upon detecting selective coupling of the first signal contact to the reference voltage.

5. A method for inputting data comprising:
selectively coupling a reference voltage to a first signal contact by a user, the first signal contact forming part of a first of a plurality of key contact groups each key contact group comprising two signal contacts;
storing a first value corresponding to the first signal contact;
interrupting computational processing of a processor, the processor comprising a hardware interrupt;
initiating a timer and resuming computational processing of the processor;
selectively coupling a second signal contact of the first key contact group to the reference voltage by a user;
upon expiration of a first timer period, interrupting computational processing of the processor and storing a second value corresponding to the second signal contact;
combining the first and second values to determine a key identifier;
disabling the hardware interrupt upon detecting selective coupling of the first signal contact to the reference voltage;
enabling the hardware interrupt upon detecting selective decoupling of the first and second signal contacts from the reference voltage;
evaluating validity of the key identifier and, if the key identifier is invalid, reenabling the hardware interrupt;
processing the key identifier by the processor as a user input; and
resuming computational processing of the processor.

6. The method of claim 5, wherein the hardware interrupt is reenabled after detecting selective decoupling of the first and second signal contacts from the reference voltage.

7. The method of claim 1, wherein OR logic is used to combine the first and second values to determine a key identifier.

8. A method for inputting data comprising:
selectively coupling a reference voltage to a first signal contact by a user, the first signal contact forming part of a first of a plurality of key contact groups each key contact group comprising two signal contacts;
storing a first value corresponding to the first signal contact;
interrupting computational processing of a processor;
initiating a timer and resuming computational processing of the processor;
selectively coupling a second signal contact of the first key contact group to the reference voltage by a user;
upon expiration of a first timer period, interrupting computational processing of the processor and storing a second value corresponding to the second signal contact;
using OR logic to combine the first and second values to determine a key identifier, the first and second values corresponding to an identifier of a signal line coupling the first and second signal contacts, respectively, to the processor;
processing the key identifier by the processor as a user input; and
resuming computational processing of the processor.

9. A method for inputting data comprising:
selectively coupling a reference voltage to a first signal contact by a user, the first signal contact forming part of a first of a plurality of key contact groups each key contact group comprising two signal contacts;
storing a first value corresponding to the first signal contact;
interrupting computational processing of a processor;
initiating a timer and resuming computational processing of the processor;
selectively coupling a second signal contact of the first key contact group to the reference voltage by a user, wherein selectively coupling a reference voltage to a first signal contact by a user and selectively coupling a second signal contact of the first key contact group to the reference voltage by a user occur non-simultaneously;
upon expiration of a first timer period, interrupting computational processing of the processor and storing a second value corresponding to the second signal contact;
combining the first and second values to determine a key identifier;
processing the key identifier by the processor as a user input; and
resuming computational processing of the processor.

10. An electronic device comprising:
a plurality of keys each electively depressible to produce a plurality of outputs; and
a processor comprising:
a plurality of data-in lines coupled to the plurality of keys;
a hardware interrupt coupled to the plurality of keys and configured to interrupt computational processing of the processor upon receiving one of the plurality of outputs, the processor programmed to read in and store a first value from the data-in lines upon triggering of the hardware interrupt; and
a timer, the processor programmed to start the timer upon triggering of the hardware interrupt and to then resume computational processing, the timer interrupting the processor upon expiration of a first delay period, the processor further programmed to read in and store a second value from the data-in lines upon being interrupted by the timer and to process the first and second values to determine a key identifier, the processor further programmed to restart the timer following the first delay period, the timer further configured to interrupt the processor upon expiration of a second delay period, and the processor further programmed to read the data-in lines to detect key release upon being interrupted by the timer after the second delay period.

11. An electronic device comprising:
a plurality of keys each electively depressible to produce a plurality of outputs; and
a processor comprising:
a plurality of data-in lines coupled to the plurality of keys;
a hardware interrupt coupled to the plurality of keys and configured to interrupt computational processing of the processor upon receiving one of the plurality of outputs, the processor programmed to read in and store a first value from the data-in lines upon triggering of the hardware interrupt;
a timer, the processor programmed to start the timer upon triggering of the hardware interrupt and to then resume computational processing, the timer interrupting the processor upon expiration of a first delay period, the processor further programmed to read in and store a second value from the data-in lines upon being interrupted by the timer and to process the first and second values to determine a key identifier; and a clock signal generator coupled to the timer, the timer measuring the first delay period according to a clock signal received from the clock signal generator concurrently with computational processing of the processor.

12. An electronic device comprising:

a keypad comprising:

a plurality of key contact groups each having two signal contacts and a reference contact, the reference contact being electrically coupled to a reference voltage;

a plurality of keys each resiliently mounted over one of the key contact groups, the keys comprising a conductive member selectively connecting the two signal contacts to the reference voltage; and a processor electrically coupled to the signal contacts of the plurality of key contact groups, the processor programmed:

to detect a first selective coupling of a first of the signal contacts to the reference voltage;

to store a first value corresponding to the first of the signal contacts and to initiate a timer upon detecting the first selective coupling and then resume processing;

to interrupt processing upon termination of a first timer period;

to detect a second selective coupling of a second of the signal contacts to the reference voltage upon termination of the timer;

to store a second value corresponding to the second of the signal contacts;

upon termination of the first timer, to detect selective decoupling of the first and second contacts from the reference voltage by reinitiating the timer;

to interrupt computational processing of the processor upon expiration of a second timer period, wherein in the event the first and second signal contacts are coupled to the reference voltage, again initiating the timer, and in the event the first and second signal contacts are not coupled to the reference voltage, disabling the timer;

to combine the first and second values to determine a key identifier; and to process the key identifier as a user input value.

13. The electronic device of claim 12, wherein the processor is programmed to repeatedly detect selective decoupling of the first and second signal contacts from the reference voltage until the timer is disabled.

14. An electronic device comprising:

a keypad comprising:

a plurality of key contact groups each having two signal contacts and a reference contact, the reference contact being electrically coupled to a reference voltage;

a plurality of keys each resiliently mounted over one of the key contact groups, the keys comprising a conductive member selectively connecting the two signal contacts to the reference voltage; and a processor electrically coupled to the signal contacts of the plurality of key contact groups, the processor comprising a hardware interrupt and wherein the first and second signal contacts of the plurality of key contact groups are electrically coupled to the hardware interrupt, the processor programmed:

to detect a first selective coupling of a first of the signal contacts to the reference voltage;

to store a first value corresponding to the first of the signal contacts and to initiate a timer upon detecting the first selective coupling and then resume processing;

to interrupt processing upon termination of a first timer period;

to detect a second selective coupling of a second of the signal contacts to the reference voltage upon termination of the timer;

to store a second value corresponding to the second of the signal contacts;

to combine the first and second values to determine a key identifier;

to enable the hardware interrupt upon detecting selective decoupling of the first and second signal contacts from the reference voltage;

to disable the hardware interrupt upon detecting selective coupling of the first signal contact to the reference voltage;

to evaluate validity of the key identifier and, if the key identifier is invalid, enable the hardware interrupt; and to process the key identifier as a user input value.

15. A method for making a keyboard entry comprising:

making a keyboard entry using a keyboard by depressing and releasing a key;

interrupting computational processing of a processor responsive to the keyboard entry;

in response to the interrupting of computational processing of the processor, using the processor to read initial data from the keyboard responsive to the keyboard entry;

in response to the interrupting of computational processing of the processor, using the processor to start a timer to initiate a timing period;

during the timing period using the processor to perform computational processing;

at a conclusion of the timing period, interrupting computational processing of the processor;

in response to the interrupting of computational processing of the processor at the conclusion of the timing period, using the processor to read delayed data from the keyboard responsive to the keyboard entry;

detecting release of the key by using the processor to start a second timing period, interrupting computational processing of the processor upon expiration of the second timer period, and using the processor to read an output of the keyboard;

using the processor to process the initial and delayed data to determine a key identifier corresponding to the keyboard entry; and using the processor to process the key identifier.

16. The method of claim 15, further comprising resuming computational processing after the reading of the delayed data from the keyboard.

* * * * *